(12) United States Patent
Nojima

(10) Patent No.: US 8,604,815 B2
(45) Date of Patent: Dec. 10, 2013

(54) PIN ELECTRONICS CIRCUIT

(75) Inventor: Shuji Nojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 163 days.

(21) Appl. No.: 13/164,992

(22) Filed: Jun. 21, 2011

(65) Prior Publication Data

US 2011/0316575 A1  Dec. 29, 2011

(30) Foreign Application Priority Data

Jun. 29, 2010 (JP) ................................. 2010-147778

(51) Int. Cl.
 G01R 1/067 (2006.01)
 G01R 31/02 (2006.01)
(52) U.S. Cl.
 USPC ................... 324/755.11; 324/555; 324/762.01
(58) Field of Classification Search
 USPC .......... 324/755.11, 755.01, 537, 500, 762.01, 324/762.03, 762.05, 762.06, 762.08, 324/762.09, 555, 763.01; 257/48; 702/118, 702/117, 108, 121
 See application file for complete search history.

(56) References Cited

U.S. PATENT DOCUMENTS

| | | | |
|---|---|---|---|
| 5,821,529 A * | 10/1998 | Chihara et al. | 250/214.1 |
| 5,945,822 A * | 8/1999 | Shiotsuka | 324/762.01 |
| 7,411,538 B1 * | 8/2008 | Piasecki | 341/161 |
| 8,299,810 B2 * | 10/2012 | Watanabe et al. | 324/755.01 |
| 2007/0208526 A1 * | 9/2007 | Staudt et al. | 702/117 |
| 2009/0134900 A1 * | 5/2009 | Awaji et al. | 324/763 |
| 2009/0194598 A1 * | 8/2009 | Kim et al. | 235/492 |
| 2009/0261841 A1 * | 10/2009 | Ohashi | 324/537 |
| 2009/0302317 A1 * | 12/2009 | Okayasu | 257/48 |

FOREIGN PATENT DOCUMENTS

| | | |
|---|---|---|
| JP | 62-152276 | 9/1987 |
| JP | 10-082837 | 3/1998 |
| JP | 2001-074816 | 3/2001 |
| JP | 2008-197073 | 8/2008 |
| WO | 2007/043482 | 4/2007 |

OTHER PUBLICATIONS

Office action dated Jul. 12, 2013 from corresponding Japanese Patent Application No. 2010-147778 and its English summary provided by the clients.

* cited by examiner

*Primary Examiner* — Hoai-An D Nguyen
(74) *Attorney, Agent, or Firm* — Ladas & Parry, LLP

(57) ABSTRACT

An I/O pin is connected to a DUT via a transmission line. A driver generates a test signal to be supplied to the DUT. A driver-side switch and an output resistor are arranged in series between the driver and the I/O pin. A comparator is arranged such that the input terminal thereof is connected to the I/O pin, and configured to judge the level of a signal output from the DUT. A short-circuit switch is arranged between the I/O pin and the ground terminal.

2 Claims, 2 Drawing Sheets

US 8,604,815 B2

PIN ELECTRONICS CIRCUIT

CROSS-REFERENCE TO RELATED APPLICATIONS

This application claims to priority to Japanese Patent Application No. 2010-147778 filed on Jun. 29, 2010 the disclosure of which is incorporated herein by reference.

BACKGROUND OF THE INVENTION

1. Field of the Invention

The present invention relates to a pin electronics circuit.

2. Description of the Related Art

In order to test semiconductor devices (which will also be referred to as "devices under test" or "DUTs" hereafter), a test apparatus is used. In order to measure a large number of DUTs at the same time, such a test apparatus includes several hundred to several thousand channels of pin electronics circuits. FIG. 1 is a block diagram which shows a configuration of a typical test apparatus. A test apparatus 1002 includes a pin electronics board 1012 and an unshown performance board. The pin electronics board 1012 and the performance board are connected to each other via a connector 16 and a cable 18. The performance board includes a socket via which the DUT is to be mounted.

The pin electronics board 1012 includes a driver DR configured to output a test signal to the DUT, and a comparator CP configured to receive a signal output from the DUT, and to judge the level of the signal thus received. The driver DR and the comparator CMP are integrated on a pin electronics IC (Integrated Circuit) 1010. A path that connects an I/O pin $P_{I/O}$ of the pin electronics IC 1010 and a given terminal A on the performance board side will be referred to as the "transmission line 20".

Such a configuration in which the driver DR and the comparator CP are connected to such a shared I/O pin $P_{I/O}$ will also be referred to as a "shared I/O configuration". Such an architecture having such a shared I/O configuration is capable of switching states between a state in which a test signal is output from the driver DR to the DUT, and a state in which the comparator CP receives a signal output from the DUT. Accordingly, a driver-side switch 22 is arranged between the output terminal of the driver DR and the I/O pin $P_{I/O}$. When the driver-side switch 22 is turned off, the driver DR is cut off from the DUT and the comparator CP.

A programmable load 30 is arranged in order to change the input impedance of the test apparatus 1002 as viewed from the test apparatus 1002. A load-side switch 24 is arranged in order to allow the programmable load 30 to be connected to and to be cut off from the transmission line 20.

The test apparatus 1002 includes a DC test unit (which will also be referred to as a "Parametric Measurement Unit" or "PMU") 32, in addition to the pin electronics board 1012. The DC test unit 32 performs a DC test operation for measuring the DC characteristics of the DUT, e.g., leak current.

The pin electronics IC 1010 and the connector 16 are connected to each other via transmission lines (strip lines or microstrip lines) 14a and 14b and an output relay 26. The DC test unit 32 is connected to the connector 16 via a DC relay 28 and the transmission line 14b. The output relay 26 and the DC relay 28 are arranged in order to switch test modes between an AC test mode and a DC test mode. When the output relay 26 is on and the DC relay 28 is off, the DUT is connected to the pin electronics IC 1010, thereby providing an AC test operation. Conversely, when the output relay 26 is off and the DC relay 28 is on, the DUT is connected to the DC test unit 32, thereby providing a DC test operation.

The above is the configuration of the test apparatus 1002. In order to predict a signal waveform output from the pin electronics IC 1010 or a signal waveform input to the pin electronics IC 1010 from the DUT, in the design of such a test apparatus 1002, the following two factors are required to be known.

(1) The device model of the transmission line 20 between the pin electronics IC 1010 and the terminal A (simulation model).

(2) The terminal impedance of the pin electronics IC 1010 side as viewed from the terminal B.

RELATED ART DOCUMENTS

Patent Documents

[Patent Document 1]
Japanese Patent Application Laid Open No. 2001-74816
[Patent Document 2]
Japanese Patent Application Laid Open No. H10-82837

In order to acquire such information, there are two main methods employed by conventional arrangements.
[First Method]

The designer of the pin electronics board 1012 has information with respect to the characteristics of the circuit components employed in the pin electronics board 1012. Thus, the designer can create an equivalent circuit model that is equivalent to the pin electronics IC 1010 and the transmission line 20. The designer obtains the high-frequency characteristics (e.g., the S-parameters) for the pin electronics IC 1010 and the transmission line 20 by measurement, and performs fitting such that the equivalent circuit model matches the circuit characteristics thus measured.

After the equivalent circuit model is created, if the design of the circuit components of the pin electronics board 1012, such as the length and width of the transmission line 14a, the length of the cable 18, the specifications of the connector 16, and so on, are changed, the designer can modify such an equivalent circuit model according to the design change by changing the corresponding circuit parameters.

With such a method, the accuracy of the fitting depends on the equivalent circuit model. However, even for a skilled engineer, it is difficult to create such an equivalent circuit model that provides an accurate fitting. Furthermore, such a method has a problem in that such a fitting operation requires a long calculation time.
[Second Method]

With the second method, the aforementioned equivalent circuit model is not employed, but the characteristics of the pin electronics IC 1010 and the transmission line 20 are directly measured, and the characteristics of these components thus measured are combined so as to provide a necessary simulation model.

Specifically, the pin electronics IC 1010 is removed from the pin electronics board 1012, and the characteristics (e.g., the S-parameter) are measured between both terminals of the transmission line 20. Subsequently, the impedance (S-parameter) of the internal circuit of the pin electronics IC 1010 as viewed from the I/O pin $P_{I/O}$ is measured. The two S-parameters thus measured are combined, thereby providing a necessary simulation model. Such a simulation model thus obtained is based on actual measured values. Thus, it can be said that such a simulation model is the most reliable.

However, with such a method, before the simulation model is created, there is a need to remove the pin electronics IC 1010 from the pin electronics board 1012, which is troublesome. Furthermore, every time a design change is made for the pin electronics board 12, measurement of the transmission line 20 must be made again in a state in which the pin electronics IC 1010 is removed from the transmission line 20.

SUMMARY OF THE INVENTION

An embodiment of the present invention has been made in order to solve such a problem. Accordingly, it is an exemplary purpose of the present invention to provide a test apparatus which is capable of easily abstracting a simulation model of a transmission line.

An embodiment of the present invention relates to a pin electronics circuit. The pin electronics circuit comprises: an input/output pin connected to a device under test via a transmission line; a driver configured to generate a test signal to be supplied to the device under test; an output resistor and a driver-side switch arranged in series between the driver and the input/output pin; a comparator arranged such that an input terminal thereof is connected to the input/output pin, and configured to judge the level of a signal output from the device under test; and a short-circuit switch arranged between the input/output pin and a ground terminal. The aforementioned components are integrated on a single semiconductor chip.

With such an embodiment, the impedance (S-parameter or reflection coefficient) of the pin electronics circuit as viewed from a given point at the terminal of the transmission line can be measured in the following three switchable states.

(1) A high-impedance state in which both the driver-side switch and the short-circuit switch are off.

(2) A predetermined-impedance state in which the driver-side switch is on and the short-circuit switch is off.

(3) A low-impedance state in which the driver-side switch is off, and the short-circuit switch is on.

A simulation model for a path between the transmission line and the input/output pin of the pin electronics circuit can be acquired using the result of the aforementioned measurement. The simulation model thus obtained is based on the actual measured value, and thus such a simulation model has a higher accuracy than one obtained by a fitting calculation using an equivalent circuit model. Furthermore, with such an arrangement, there is no need to remove the pin electronics IC from the pin electronics board even if the design of the transmission line is changed. In this case, by measuring the impedance again in the two electrically switchable states, such an arrangement is capable of providing a new simulation model.

Also, the short-circuit switch may be arranged in the vicinity of the input/output pin. By arranging the short-circuit switch at a position nearest to the input/output pin, such an arrangement provides a low-impedance state in which the impedance is near to zero.

Another embodiment of the present invention relates to a test apparatus. The test apparatus comprises: an input/output pin connected to a device under test via a transmission line; a driver configured to generate a test signal to be supplied to the device under test; an output resistor and a driver-side switch arranged in series between the driver and the input/output pin; a comparator arranged such that an input terminal thereof is connected to the input/output pin, and configured to judge the level of a signal output from the device under test; and a short-circuit switch arranged between the input/output pin and a ground terminal.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, or that does not damage the functions or effects of the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, or that does not damage the functions or effects of the electric connection therebetween, in addition to a state in which the member A is directly connected to the member C, or the member B is directly connected to the member C.

Figure 1:
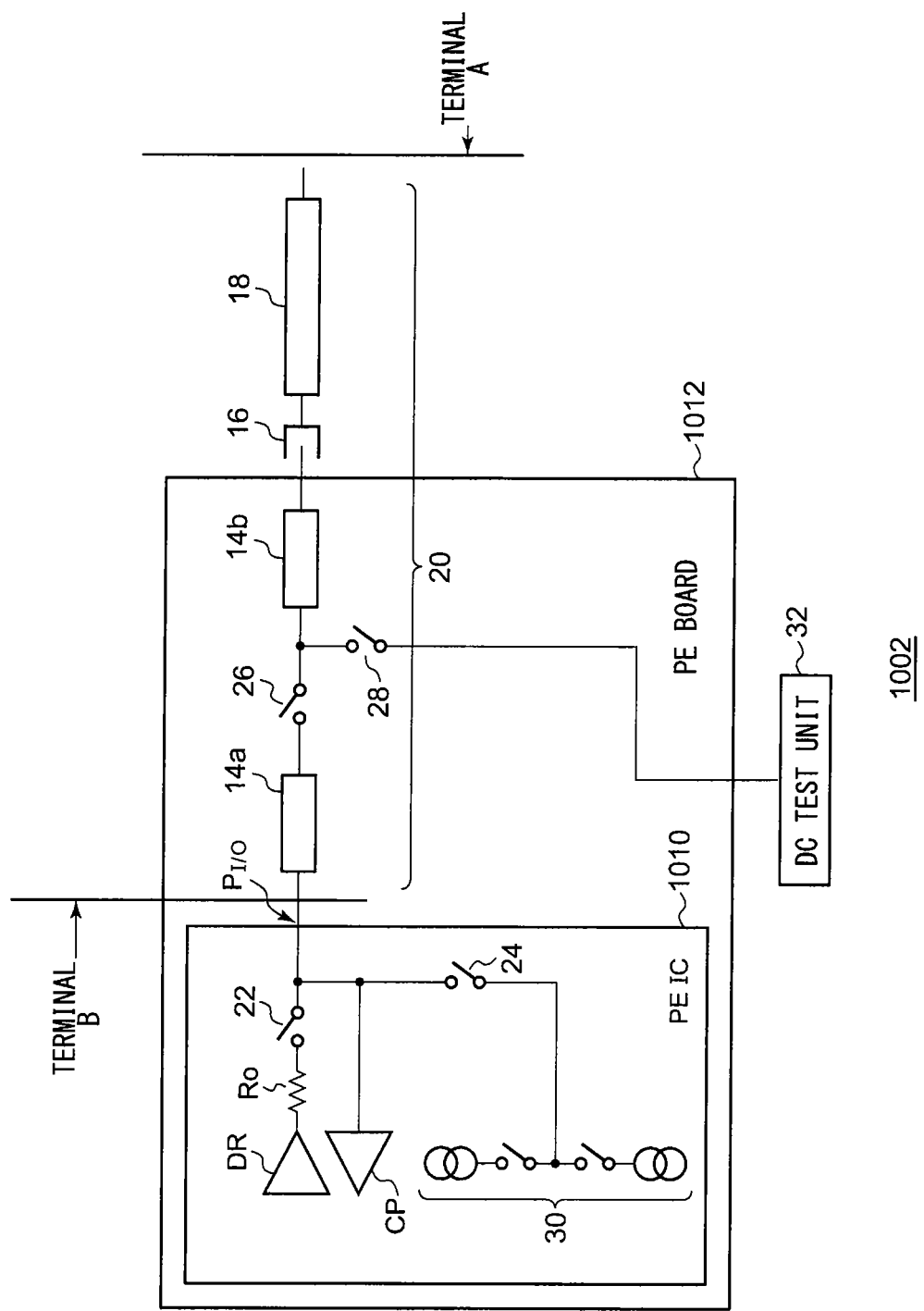
FIG. 1 is a block diagram which shows a configuration of a typical test apparatus.
Figure 2:
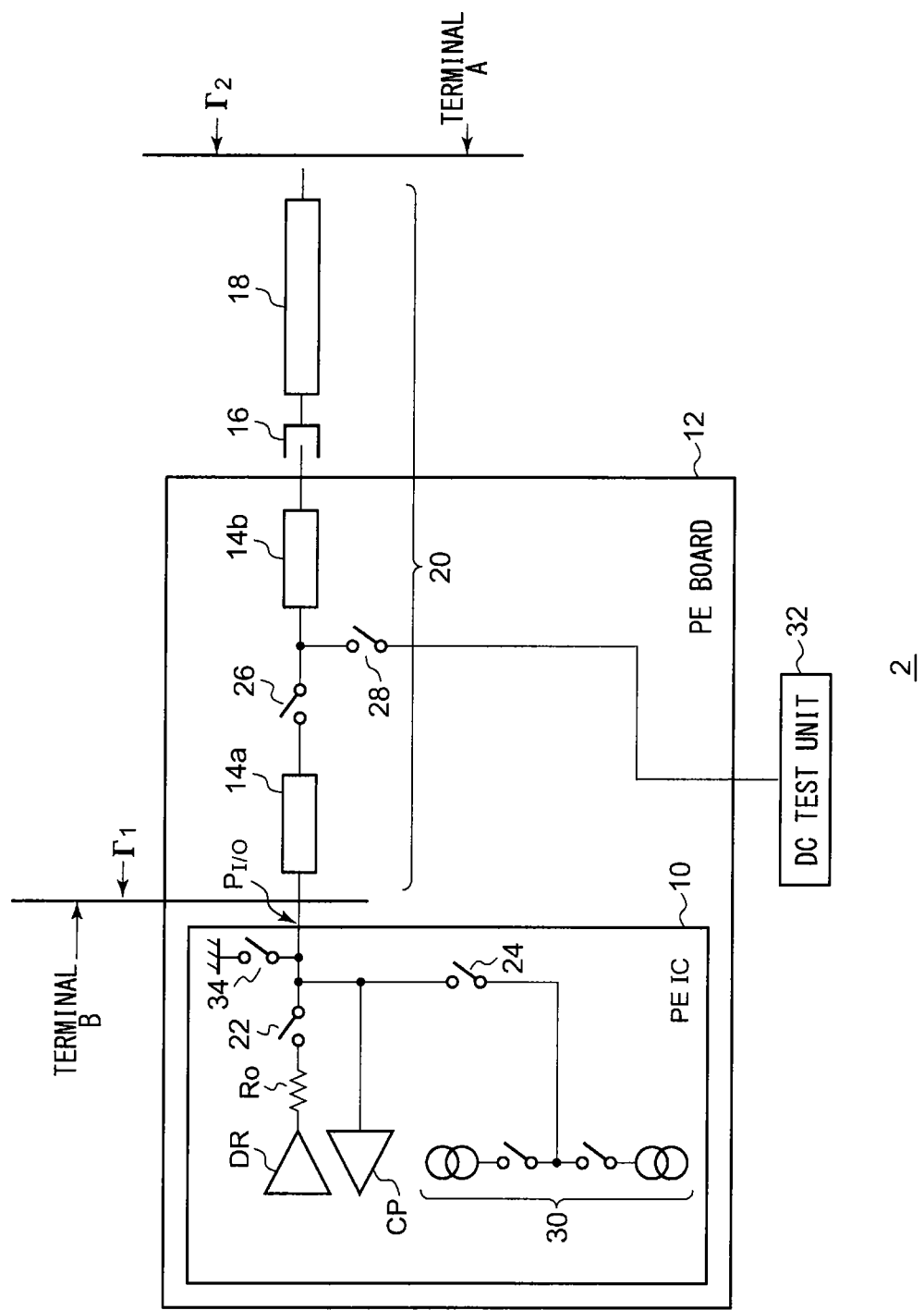
FIG. 2 is a circuit diagram which shows a configuration of a test apparatus including a pin electronics IC according to an embodiment.

FIG. 2 is a circuit diagram which shows a configuration of a test apparatus 2 including a pin electronics IC 10 according to an embodiment. The test apparatus 2 includes a pin electronics board 12. A connector 16 of the pin electronics board 12 is connected to a performance board (not shown) via a cable 18. The performance board includes a socket for connecting the DUT.

The pin electronics board 12 is configured using an architecture which is referred to as a "shared I/O configuration". That is to say, in the pin electronics board 12, a driver DR configured to output a test signal to the DUT is connected via a shared I/O pin $P_{I/O}$ to a comparator CP configured to receive a signal from the DUT and to judge the level of the signal thus received. The driver DR and the comparator CMP are integrated on a single semiconductor chip, which will be referred to as the "pin electronics IC 10". The transmission line that connects the I/O pin $P_{I/O}$ of the pin electronics IC 10 and a given terminal A on the performance board side will be referred to as the "transmission line 20".

With such a shared I/O configuration architecture, such an arrangement is capable of switching states between a state in which the driver DR outputs a test signal to the DUT, and a state in which the comparator CP receives a signal output from the DUT. Accordingly, a driver-side switch 22 is arranged between the output terminal of the driver DR and the I/O pin $P_{I/O}$. When the driver-side switch 22 is turned off, the driver DR is cut off from the DUT and the comparator CP. An output resistor Ro is arranged between the driver DR and the driver-side switch 22. The output resistor Ro also functions as a terminal resistor when the pin electronics IC 10 receives a signal output from the DUT, and is designed as a resistor having a resistance of 50Ω, for example.

A programmable load 30 is arranged in order to allow the input impedance of the test apparatus 2 as viewed from the DUT to be changed. A load-side switch 24 is arranged in order to allow the programmable load 30 to be connected to and to be cut off from the transmission line 20.

Furthermore, the pin electronics IC 10 includes a short-circuit switch 34. The short-circuit switch 34 is arranged between the I/O pin $P_{I/O}$ and the ground terminal. The short-circuit switch 34 is arranged at a position as close to the I/O pin $P_{I/O}$ as possible such that the impedance of the I/O pin $P_{I/O}$ becomes as small as possible, and preferably becomes zero, when the short-circuit switch 34 is on.

The test apparatus 2 includes a DC test unit (which will be referred to as the "Parametric Measurement Unit" or "PMU") 32, in addition to the pin electronics board 12. The DC test unit 32 performs a DC test for measuring the DC characteristics of the DUT, e.g., the leak current thereof.

The pin electronics IC 10 and the connector 16 are connected to each other via transmission lines 14a and 14b and an output relay 26. The DC test unit 32 is connected to the connector 16 via a DC relay 28 and the transmission line 14b. The output relay 26 and the DC relay 28 are arranged in order to allow switching between the AC test mode and the DC test mode. When the output relay 26 is on and the DC relay 28 is off, the DUT is connected to the pin electronics IC 10, thereby providing an AC test operation. Conversely, when the output relay 26 is off and the DC relay 28 is on, the DUT is connected to the DC test unit 32, thereby providing a DC test operation.

The above is the configuration of the test apparatus 2. In order to predict a signal waveform output from the pin electronics IC 1010 or a signal waveform input to the pin electronics IC 1010 from the DUT, in the design of such a test apparatus 1002, the following two factors are required to be known.

(1) The device model of the transmission line 20 between the pin electronics IC 1010 and the terminal A (simulation model).

(2) The terminal impedance of the pin electronics IC 1010 side as viewed from the terminal B.

With such a test apparatus 2, the aforementioned simulation model can be suitably acquired. Description will be made below regarding a measurement method for the simulation model.

The impedance (complex reflection coefficient) $\Gamma_2$ of the pin electronics IC 10 side as viewed from a given terminal A is measured in the following three states. The measurement is made in a state in which the output relay 26 is on and the DC relay 28 is off.

(1) High Impedance State (Hi-Z)

The driver-side switch 22, the short-circuit switch 34, and the load-side switch 24 are turned off, so as to set the pin electronics IC 10 to the high-impedance state. In this state, the reflection coefficient $\Gamma_2$ is measured, and the measurement result will be represented by $\Gamma_{2\text{-}Open}$.

(2) Short-Circuit State

The driver-side switch 22 and the load-side switch 24 are turned off, and the short-circuit switch 34 is turned on, so as to set the pin electronics IC 10 to the short-circuit state. In this state, the reflection coefficient $\Gamma_2$ is measured, and the measurement result will be represented by $\Gamma_{2\text{-}Short}$.

(3) Termination State

The driver-side switch 22 is turned on, and the load-side switch 24 and the short-circuit switch 34 are turned off, so as to set the pin electronics IC 10 to a 50Ω termination state. In this state, the reflection coefficient $\Gamma_2$ is measured, and the measurement result will be represented by $\Gamma_{2\text{-}Term}$.

With the complex reflection coefficient of the pin electronics IC 10 as $\Gamma_1$, and with the components of the S-parameter of the transmission line 20 as $S_{11}$, $S_{12}$, $S_{21}$, and $S_{22}$, the reflection coefficient $\Gamma_2$ of the pin electronics IC 10 side as viewed from the terminal A is represented by the following Expression using $\Gamma_1$ and the S-parameters.

$$\Gamma_2 = S_{11} + S_{12} S_{21} \Gamma_1 / (1 - S_{22} \Gamma_1) \tag{1}$$

Ideally, the reflection coefficients $\Gamma_1$ of the pin electronics IC 10 in the open-circuit state, the short-circuit state, and the 50Ω termination state are respectively represented by the following Expressions (2) through (4).

$$\Gamma_{1\text{-}Open} = 1 \tag{2}$$

$$\Gamma_{1\text{-}Short} = -1 \tag{3}$$

$$\Gamma_{1\text{-}Term} = 0 \tag{4}$$

The reflection coefficient $\Gamma_2$ in the ideal state as viewed from the terminal A can be obtained by substituting Expressions (2) through (4) into Expression (1), thereby obtaining the following Expressions (5) through (7).

$$\Gamma_{2\text{-}Open} = S_{11} + S_{12} S_{21} / (1 - S_{22}) \tag{5}$$

$$\Gamma_{2\text{-}Short} = S_{11} - S_{12} S_{21} / (1 + S_{22}) \tag{6}$$

$$\Gamma_{2\text{-}Term} = S_{11} \tag{7}$$

$S_{11}$ is obtained by solving the Expressions (5) through (7), thereby obtaining the following Expressions (8) through (10).

$$S_{11} = \Gamma_{2\text{-}Term} \tag{8}$$

$$S_{22} = (\Gamma_{2\text{-}Open} + \Gamma_{2\text{-}Short} - 2\Gamma_{2\text{-}Term}) / (\Gamma_{2\text{-}Open} - \Gamma_{2\text{-}Short}) \tag{9}$$

$$S_{12} S_{21} = -2(\Gamma_{2\text{-}Open} - \Gamma_{2\text{-}Term})(\Gamma_{2\text{-}Short} - \Gamma_{2\text{-}Term}) / (\Gamma_{2\text{-}Open} - \Gamma_{2\text{-}Short}) \tag{10}$$

When the S-parameters are reciprocal, the relation $S_{12} = S_{21}$ holds true, and accordingly, the following Expression (11) is obtained.

$$S_{12} = S_{21} = \sqrt{\{-2(\Gamma_{2\text{-}Open} - \Gamma_{2\text{-}Term})(\Gamma_{2\text{-}Short} - \Gamma_{2\text{-}Term}) / (\Gamma_{2\text{-}Open} - \Gamma_{2\text{-}Short})\}} \tag{11}$$

As described above, with the test apparatus 2 according to the embodiment, the S parameter of the transmission line 20, i.e., the simulation model can be acquired based upon the Expressions (8) through (11) using the reflection coefficient $\Gamma_{2\text{-}Open}$ measured in the open-circuit state, the reflection coefficient $\Gamma_{2\text{-}Short}$ measured in the short-circuit state, and the reflection coefficient $\Gamma_{2\text{-}Term}$ measured in the termination state.

Such a test apparatus 2 has an advantage that the reflection coefficient $\Gamma_1$ of the pin electronics IC 10 as viewed from the terminal A can be measured without the need to remove the pin electronics IC 10, even if the characteristics of the transmission line 20 are changed.

Description has been made above regarding an arrangement in which the pin electronics IC 10 exhibits an ideal impedance when Expressions (5) through (7) are introduced. However, it should be noted that there is not necessarily a need to set the impedance to an ideal value. Also, the pin electronics IC 10 may have known impedance. That is to say, simultaneous equations can be introduced based upon Expression using the reflection coefficients of the pin electronics IC 10, i.e., $\Gamma_{1\text{-}Open}$, $\Gamma_{1\text{-}Short}$, and $\Gamma_{1\text{-}Term}$ measured beforehand. Thus, the S-parameters of the transmission line 20 can be acquired by solving the simultaneous equations thus introduced. With such an arrangement, the reflection coefficients $\Gamma_1$ of the pin electronics IC 10 should be measured only once, after which there is no need to remove the pin electronics IC 10 from the pin electronics board 12, thereby maintaining the same advantages as those described above.

Description has been made regarding an arrangement according to the present invention with reference to the embodiments. The above-described embodiments have been described for exemplary purposes only, and are by no means intended to be interpreted restrictively. Rather, various modifications may be made to the aforementioned components, processes, and combinations thereof. Description will be made below regarding such modifications.

Description has been made regarding an arrangement in which the short-circuit switch 34 is included as a built-in component in the pin electronics IC 10. Also, the short-circuit switch may be arranged on the pin electronics board 12.

While the preferred embodiments of the present invention have been described using specific terms, such description is for illustrative purposes only, and it is to be understood that changes and variations may be made without departing from the spirit or scope of the appended claims.

What is claimed is:

1. A pin electronics circuit comprising:
an input/output pin connected to a device under test via a transmission line;
a driver configured to generate a test signal to be supplied to the device under test;
an output resistor and a driver-side switch arranged in series between the driver and the input/output pin;
a comparator arranged such that an input terminal thereof is connected to the input/output pin, and configured to judge the level of a signal output from the device under test; and
a short-circuit switch arranged between the input/output pin and a ground terminal, wherein the short-circuit switch is further arranged at a position nearest to the input/output pin so as to provide a low impedance state in which the impedance is near to zero when the short-circuit switch is on;
wherein the aforementioned components are integrated on a single semiconductor chip.

2. A test apparatus comprising:
an input/output pin connected to a device under test via a transmission line;
a driver configured to generate a test signal to be supplied to the device under test;
an output resistor and a driver-side switch arranged in series between the driver and the input/output pin;
a comparator arranged such that an input terminal thereof is connected to the input/output pin, and configured to judge the level of a signal output from the device under test; and
a short-circuit switch arranged between the input/output pin and a ground terminal, wherein the short-circuit switch is further arranged at a position to the input/output pin so as to provide a low impedance state in which the impedance is near to zero when the short-circuit switch is on.

* * * * *